(12) United States Patent
Mori

(10) Patent No.: US 8,796,144 B2
(45) Date of Patent: Aug. 5, 2014

(54) METHOD OF FORMING THIN FILM INTERCONNECT AND THIN FILM INTERCONNECT

(71) Applicant: Mitsubishi Materials Corporation, Tokyo (JP)

(72) Inventor: Satoru Mori, Naka (JP)

(73) Assignee: Mitsubishi Materials Corporation, Tokyo (JP)

( * ) Notice: Subject to any disclaimer, the term of this patent is extended or adjusted under 35 U.S.C. 154(b) by 0 days.

(21) Appl. No.: 13/767,125

(22) Filed: Feb. 14, 2013

(65) Prior Publication Data

US 2013/0214412 A1    Aug. 22, 2013

(30) Foreign Application Priority Data

Feb. 16, 2012  (JP) .................................. 2012-032058

(51) Int. Cl.
*H01L 21/44* (2006.01)

(52) U.S. Cl.
USPC ......................................................... 438/687

(58) Field of Classification Search
None
See application file for complete search history.

(56) References Cited

U.S. PATENT DOCUMENTS

| 6,646,353 B1 * | 11/2003 | Lopatin ...................... 257/774 |
| 2011/0084337 A1 * | 4/2011 | Yamazaki et al. ............ 257/347 |

FOREIGN PATENT DOCUMENTS

| JP | 04-349637 A | 12/1992 |
| JP | 3302894 B | 7/2002 |
| JP | 2004-163901 A | 6/2004 |
| JP | 2010-103324 A | 5/2010 |

* cited by examiner

*Primary Examiner* — Scott B Geyer
(74) *Attorney, Agent, or Firm* — Edwards Wildman Palmer LLP

(57) ABSTRACT

A method of forming a thin film interconnect in which a film is formed by sputtering method using a Cu—Ca alloy target and a thin film interconnect formed by the method, the method comprising: forming a Cu—Ca alloy film by sputtering method using a Cu—Ca alloy target that contains 0.5 atomic % or more and less than 5 atomic % of Ca, and the balance consisting of Cu and unavoidable impurities; and performing heat treatment of the Cu—Ca alloy film at a temperature of 300 to 700° C. in an inert gas atmosphere containing trace amount of oxygen defined by oxygen partial pressure in the range of $10^{-4}$ to $10^{-10}$ atm.

8 Claims, 4 Drawing Sheets

REDUCTION OF Cu-X-O FILM USING $H_2$ PLASMA

METHOD OF FORMING THIN FILM INTERCONNECT AND THIN FILM INTERCONNECT

BACKGROUND OF THE INVENTION

1. Field of the Invention

The present invention relates to a method of forming a thin film interconnect disposed on a substrate of liquid-crystal display or the like, and also relates to a thin film interconnect formed by the same method.

Priority is claimed on Japanese Patent Application No. 2012-032058 filed on Feb. 16, 2012, the content of which is incorporated herein by references.

2. Description of Related Art

Liquid crystal displays, plasma displays, organic liquid crystal displays, inorganic liquid crystal displays or the like are known as flat panel displays that are operated by active matrix method utilizing thin film transistors (hereafter referred to as TFTs).

In flat panel displays (hereafter referred to as FPDs) using these TFTs, interconnects formed of metal film adhere to a surface of a substrate such as a glass substrate, and each TFT is formed on the cross section of grid-like interconnects made of the metal film.

FIG. 1 is a vertical cross section schematically showing a structure of a generally known TFT. This TFT is constituted of sequentially stacked films that include a gate electrode film 2 made of a pure copper film, a silicon nitride film 3, a Si semiconductor film 4, a silicon oxide barrier film 5 stacked sequentially on the glass substrate 11, and a drain electrode film 7 and a source electrode film 8 that are stacked on the barrier film 5 and that are separated by a trench 6.

During production of TFTs having such a stacked structure, the trenches that separate drain electrode films and source electrode films are formed by wet etching and plasma etching.

At that time, the surface of Si semiconductor film exposed to the bottom surface of the trench has an extremely unstable state. That is, uncombined bonds (dangling bonds) increase in the bottom surface of the trench and constitute surface defects. The surface defects generate leakage current and the leakage current increases the off current of the TFT. As a result, it is impossible to avoid problems such as a decreasing contrast of FPD and a narrowed angle of view. In a method for reducing leakage current of the surface of the semiconductor substrate described in Japanese Patent Application, First Publication No. H04-349647, the surface state of a silicon semiconductor substrate is stabilized by bonding the uncombined bonds (dangling binds) with hydrogen through hydrogen plasma treatment of a surface of the trench using pure (100%) hydrogen gas under a flow rate of 10 to 1000 SCCM, hydrogen gas pressure of 10 to 500 Pa, RF current density of 0.005 to 0.5 W/cm$^2$, and a treatment time of 1 to 60 minutes.

Japanese Patent Application, First Publication No. 2010-103324 describes a TFT in which the barrier film and the electrode film are bonded with high adhesion strength by the effect of a adhesion-enhancement film that is interposed between the barrier film made of a silicon oxide film and the pure copper film that constitute the drain electrode and the source electrode.

The adhesion-enhancement film is constituted of two regions composed of copper purification region formed on the side of the electrode, and a component concentrating region formed in the vicinity of interface with the barrier film. The component concentrating region is composed of Cu, Ca, oxygen, and Si, where peak concentration of Ca in the thickness direction is 5 to 20 atomic %, and peak concentration of oxygen in the thickness direction is 30 to 50 atomic %.

Japanese Patent No. 3302894 describes a preparation of an interconnect layer by forming a conductive layer, and subsequently heat treating the conductive layer in oxygen atmosphere, thereby forming a thermal oxide layer. In this method, the conductive layer is constituted of a material that is mainly composed of at least one first metal selected from the group consisting of Ag, Au, Cu, and Pt, and that includes at least one second metal selected from the group consisting of Ti, Zr, Hf, Ta, Nb, Si, B, La, Nd, Sm, Eu, Gd, Dy, Y, Yb, Ce, Mg, Th, and Cr. The thermal oxide layer formed on the surface of the conductive layer is constituted of a material that is mainly composed of the second metal such that the proportion of the second metal to the first metal is larger in the thermal oxide layer than in the conductive layer. The thus formed TFT has durability to treatments with various chemical substances and has an interconnect layer that is highly adhesive to the substrate.

It is known that durability of the gate interconnects and data interconnects formed on the array substrate are highly important as elements for determining the quality of the image of FPD. It is also known that signal delay of the input signal can be reduced, resulting in improvement of image quality, where the gate interconnects and the data interconnects have small durability. Because of its small durability, Cu has been used in gate interconnects or in data interconnects. However, use of Cu in the gate interconnects is accompanied with a problem of inferior contact properties of Cu with the substrate. As a solution for this problem, Japanese Patent Application First Publication, No. 2004-163901 describes use of Ti layer or Mo layer as a metal buffer layer interposed between the substrate and the Cu layer.

On the other hand, in accordance with remarkable increase of display size and integration of various FPDs in recent years, there is a demand for still higher adhesion strength between the stacked films constituting TFTs. However, in the conventional TFT described in Japanese Patent Application, First Publication, No. H04-349637, high adhesion strength that satisfies the above-described demand is not provided due to weak adhesion strength between the silicon oxide film (barrier film) and the pure copper film (electrode film) separated by the trench.

In the conventional type TFT described in Japanese Patent Application, First Publication No. 2010-103324, high adhesive strength is provided by the presence of adhesion enhancement film interposed between the silicon oxide film (barrier film) and the pure copper film (electrode film). However, it is necessary to modify the structure of apparatus due to the use of oxygen gas as the sputtering gas in the production process of TFTs, resulting in an increase of production costs and deterioration of productivity. Therefore, the technique of Japanese Patent Application, First Publication No. 2010-103324 included a severe problem in practical application to TFTs, since there is a demand for cost reduction of TFTs in accordance with the spread of large screen FPDs.

In some case of the recent production process of TFTs, the above-described hydrogen plasma treatment is performed after formation of the source electrode and the drain electrode. The conventional TFTs described in Japanese Patent No. 3302894 included problems of inferior hydrogen plasma durability such that the Cu alloy oxide layer is reduced by hydrogen plasma, resulting in deterioration of adhesion. On the other hand, where Cu was used as the first type metal, there was a problem of relatively high resistivity compared to the conventional Cu based material.

The post-process of the interconnect process described in, Japanese Patent Application, First Publication No. 2004-163901, where Cu is used as gate interconnects and Mo ad/or Ti are used as a metal buffer layer, often accompanies wet etching. However, it is difficult to etch Mo or Ti and Cu with the same etchant because of largely different electrochemical properties. Therefore, there was a problem in that etching must be performed using a plurality of etchant.

An object of the present invention is to provide a method that is capable of, using an existing sputtering apparatus, forming a Cu-alloy thin film interconnect that has high adhesion strength with a substrate, low resistivity, and excellent hydrogen plasma durability, and that can be etched with a single etchant. Another object of the present invention is to provide a Cu-alloy thin film interconnect that is formed by the production method and that has low resistivity and high hydrogen plasma durability.

SUMMARY OF THE INVENTION

In order to improve hydrogen plasma durability in the Cu alloy thin film, the inventors investigated additional elements that provide more stable oxides than the oxides of conventional additional elements in the Cu-alloy, and also made extensive research regarding the relationship between heat treatment conditions and film properties based on evaluation of properties of alloy films with various additional elements while variously changing heat treatment conditions after film formation by sputtering. As a result, the below described findings were obtained.

(a) It was confirmed that adhesion of the adhesion layer was deteriorated by hydrogen plasma treatment where the adhesion layer was formed by the conventional Cu-alloy oxide film as described in Japanese Patent No. 3302894. Such a deterioration of adhesion due to the exposure to the hydrogen plasma can be explained as follows. As shown in FIG. 2, hydrogen ions transmit the Cu film of the upper layer by the exposure to hydrogen plasma and reduce the Cu-alloy oxide film of the lower layer. By this phenomenon, micro-voids are formed in the interface with the under member, thereby deteriorating adhesion.

(b) On the other hand, where a Cu—Ca alloy thin film is formed by the sputtering method using a Cu—Ca alloy target, and is subsequently heat treated in an inert gas atmosphere containing trace amount (small amount) of oxygen, Cu—Ca alloy oxide film is formed in the interface between the Cu—Ca alloy film and the substrate or barrier film. At that time, since the crystal grain boundaries of the Cu—Ca alloy thin film formed by the sputtering method are continuously formed from the surface of the film to the interface with the substrate or the like, oxygen atoms diffuse relatively easily through the grain boundaries and reach the interface, and are spread all over the interface by interface diffusion, resulting in formation of Cu—Ca alloy oxide layer. The Cu—Ca alloy oxide layer reacts with glass (substrate) and/or silicon oxide (barrier film) and form strong chemical bonds.

(c) In addition, it was found that Cu—Ca alloy oxide film containing predetermined amount of Ca showed satisfactory durability to hydrogen plasma. Therefore, the Cu—Ca alloy oxide film that has been formed in the interface with the substrate (under-layer) is not reduced by hydrogen plasma, and maintains strong adhesion.

(d) Further, since the oxygen source of the Cu—Ca alloy oxide film is a trace amount of oxygen contained in the inert gas atmosphere at the time of heat treatment, it is possible to form the Cu—Ca alloy oxide film while avoiding requirements for modification of film-forming apparatus or complicated treatments or operations. On the other hand, to form a Cu—Ca alloy oxide film by oxygen reactive sputtering, it is necessary to control the flow rates of the reaction gas (oxygen gas) and discharge gas independently and precisely so as to generate stable plasma while maintaining a predetermined amount of oxygen. For this control, it is necessary to implement reaction gas introduction piping, flow rate meters, flow rate valves or the like. Therefore, high production cost and inferior productivity could not be avoided.

(e) As a result of extensive research by the inventors, it was found that a desired Cu—Ca alloy oxide film can be formed by using a existing film forming apparatus without requiring complicated operations by a method including heat treatment of a Cu—Ca alloy film in inert gas atmosphere containing a trace amount of oxygen after forming the Cu—Ca alloy film using a general sputtering method. Since generation of plasma is not required in the heat treatment, it is possible to avoid a possibility of abnormal discharge due to change or flow rates of reaction gas or discharge gas or change of substrate temperature. In addition, it is possible to perform the heat treatment simply by using a existing apparatus by preliminarily introducing predetermined trace amount of oxygen gas into the inert gas introduced into the film forming apparatus.

(f) Further, since the etching rates of Cu and Cu—Ca alloy are substantially the same, it is possible to perform the etching using the same etchant (etching fluid).

The present invention was made based on the above-described findings.

A first aspect of the present invention is a method of forming a thin film interconnect in which a film is formed by the sputtering method using a Cu—Ca alloy target, the method comprising: forming a Cu—Ca alloy film by sputtering method using a Cu—Ca alloy target that contains 0.5 atomic % or more and less than 5 atomic % of Ca, and the balance consisting of Cu and unavoidable impurities; and performing heat treatment of the Cu—Ca alloy film at a temperature of 300 to 700° C. in an inert gas atmosphere containing a trace amount of oxygen defined by oxygen partial pressure in the range of $10^{-4}$ to $10^{-10}$ atm.

A second aspect of the present invention is a method of forming a thin film interconnect according to the above-described first aspect, wherein an average thickness of the Cu—Ca alloy film is 10 to 500 nm.

A third aspect of the present invention is a method of forming a thin film interconnect according to the above-described first or second aspect, further comprising forming a Cu film on the Cu—Ca alloy film after forming the Cu—Ca alloy film. In this third aspect, the Cu film may be formed before the heat treatment.

The fourth aspect of the present invention is a method of forming a thin film interconnect according to the above-described first or second aspect, further comprising forming a Cu film on the Cu—Ca alloy film after the heat treatment.

A fifth aspect of the present invention is a thin-film interconnect formed by a method according to any one of the above-described first to fourth aspects, wherein the peak value of Ca concentration of the Cu—Ca alloy film in depth direction of the film measured by auger electron spectroscopy is 0.5 atomic % or more and less than 5 atomic % in proportion of an amount of Ca in sum of an amount of Cu and the amount of Ca.

In the above-described first to fourth aspect, the Cu—Ca alloy film may be formed on a substrate, for example, selected from a $SiO_2$ substrate, glass substrate, semiconductor substrate (e.g., Si substrate) having an oxide film on the surface thereof Therefore, the thin film interconnect may be a thin film interconnect formed on the above-described substrate. The above-described heat treatment may be performed by heat treatment of the substrate having the Cu—Ca alloy film or the Cu—Ca alloy film and the Cu film formed thereon.

According to the present invention, a thin film interconnect is formed by a novel method including a two step treatment that includes (1) formation of a Cu—Ca alloy film by a sputtering method using a Cu—Ca alloy target composed of 0.5 atomic % or more and less than 5 atomic % of Ca and the balance consisting of Cu and unavoidable impurities, and (2) heat treatment at a temperature of 300 to 700° C. in an inert gas atmosphere containing a trace amount of oxygen having oxygen partial pressure of $10^{-4}$ to $10^{-10}$ atm. By this method, it is possible to obtain a Cu-alloy thin film interconnect that has high adhesion with the substrate, low resistivity, and excellent hydrogen plasma durability, and that can be etched with a single etchant. In addition, an existing sputtering apparatus may be used without modification in the formation of the thin film interconnect. Therefore, it is possible to obtain thin film interconnect having high adhesion strength, low resistivity, and excellent hydrogen plasma durability that satisfy the requirements for large screen FPD and highly integrated FPD while largely reducing the production cost of the FPD.

DETAILED DESCRIPTION OF THE INVENTION

Figure 1:
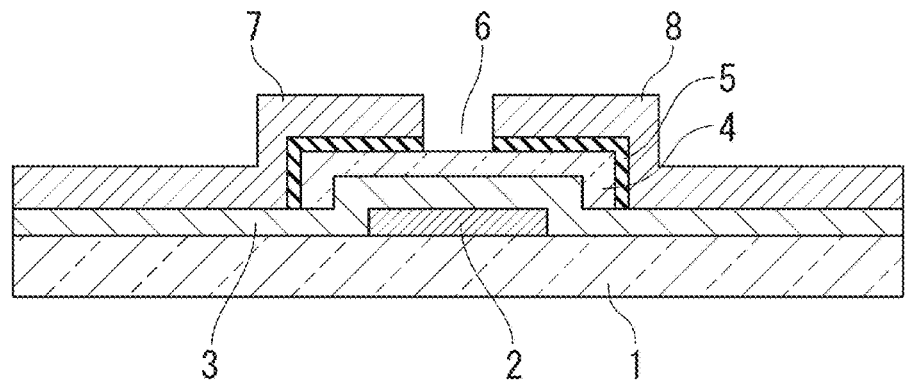
FIG. 1 is a schematic drawing that shows a vertical cross section of a thin-film transistor.
Figure 2:
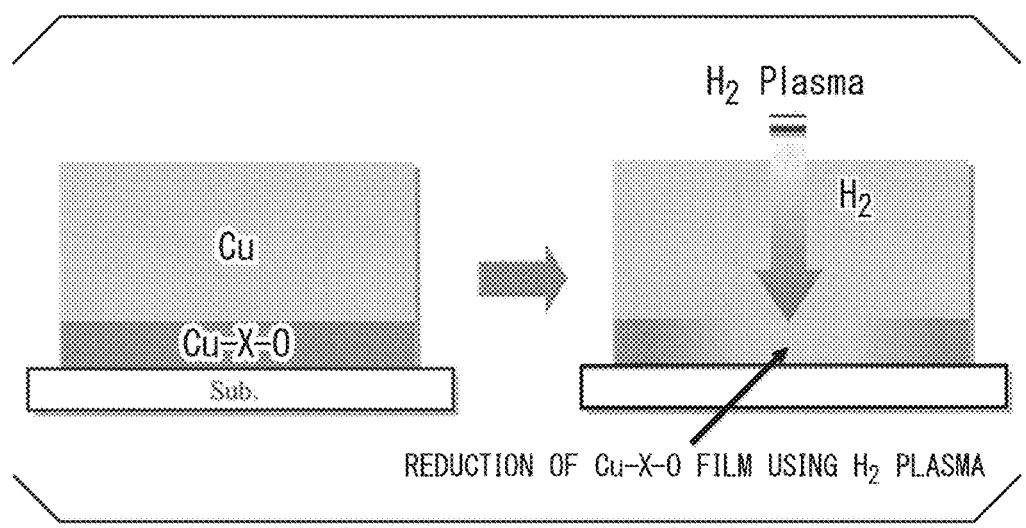
FIG. 2 is a drawing that shows modeling process of deterioration of adhesion due to exposure to hydrogen plasma.
Figure 3A:
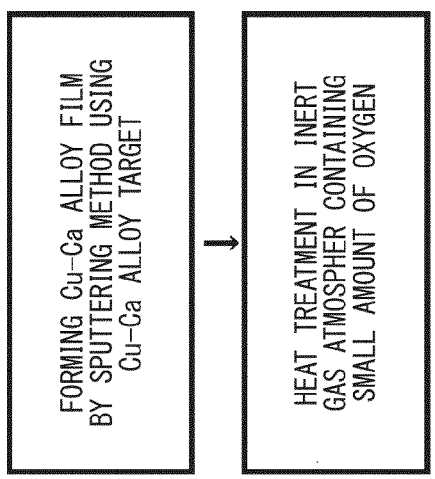
FIGS. 3A, 3B, and 3C show flow diagrams of a formation process of the thin film interconnect according to the present invention.

An embodiment of the present invention is a method of forming a thin film interconnect comprising forming a Cu—Ca alloy film by a sputtering method using a Cu—Ca target, and subsequently performing heat treatment under an inert gas atmosphere containing trace amount of oxygen having an oxygen partial pressure of $10^{-4}$ to $10^{-10}$ atm (FIG. 3A).

Figure 3B:
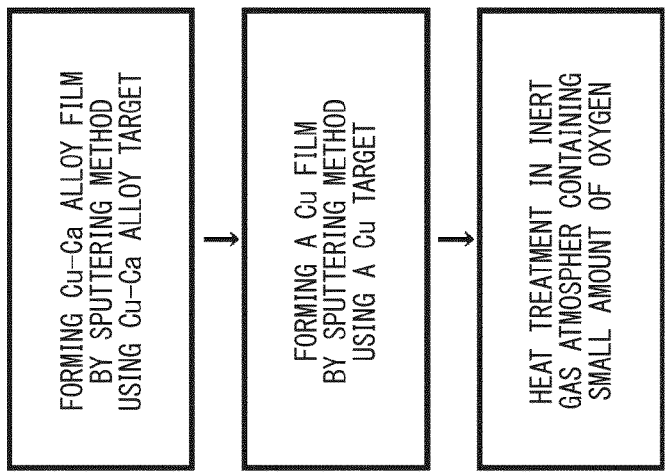

Another embodiment of the present invention is a method of forming a thin film interconnect comprising forming a Cu—Ca alloy film by the sputtering method using a Cu—Ca target, subsequently forming a Cu film on the Cu—Ca alloy film, and subsequently performing heat treatment under an inert gas atmosphere containing a trace amount of oxygen having an oxygen partial pressure of $10^{-4}$ to $10^{-10}$ atm (FIG. 3B).

Figure 3C:
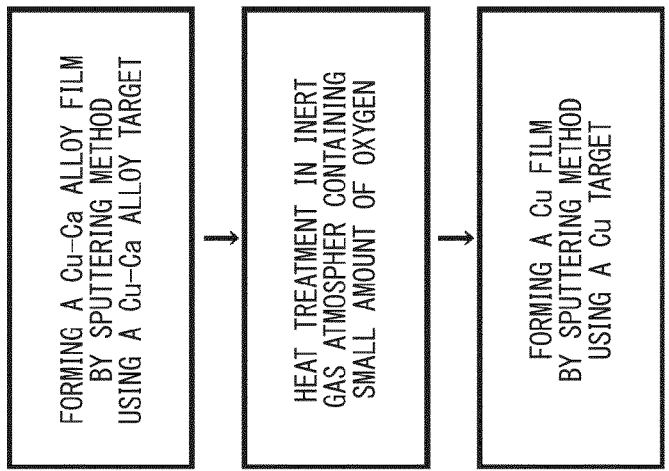

Another embodiment of the present invention is a method of forming a thin film interconnect comprising forming a Cu—Ca alloy film by sputtering method using a Cu—Ca target, subsequently performing heat treatment under an inert gas atmosphere containing a trace amount of oxygen having an oxygen partial pressure of $10^{-4}$ to $10^{-10}$ atm, and subsequently forming a Cu film on the Cu—Ca alloy film (FIG. 3C).

An embodiment of the present invention is a thin film interconnect that is formed by any one of the above-described methods, wherein an amount of Ca in the film is 0.5 atomic % or more and less than 5 atomic %.

In the above-described embodiments, the Cu—Ca alloy film may be formed on a substrate. The heat treatment of the alloy film or the heat treatment of the alloy film and the Cu film may be performed by heat treatment of the substrate after forming the film (or films) on the substrate. The substrate may be selected from those generally used in TFT. For example, the substrate may be selected from $SiO_2$ substrate, glass substrate, semiconductor substrate (e.g., Si substrate) having an oxide film on the surface thereof Interconnect pattern of thin film interconnect may be formed after forming the alloy film or the alloy film and the Cu film by a method (for example, etching) generally used in the formation of interconnect pattern of a thin-film interconnect.

Hereafter, the numerical limitation in the embodiment of the present invention is explained.

(a) Trace Amount of Oxygen:

Where the trace amount of oxygen during the heat treatment is less than $10^{-10}$ atm in oxygen partial pressure, adhesion of the film with the substrate is insufficient, for example, due to the insufficient oxidization of Cu—Ca alloy film resulting in insufficient formation of Cu—Ca alloy oxide film in the interface with the substrate such as $SiO_2$ and glass. Although adhesion may be obtained where Ca concentration is 5 atomic % or more due to reduction reaction of Ca with $SiO_2$, resistivity is increased due to diffusion of Si formed by reduction of $SiO_2$ by Ca into Cu. On the other hand, where the oxygen partial pressure exceeds $10^{-4}$ atm, it is not preferable since the resistivity increases due to excessive oxidization of Cu—Ca alloy oxide film. Therefore, the trace amount of oxygen during the heat treatment was determined to be $10^{-4}$ to $10^{-10}$ atm in oxygen partial pressure. The pressure of the atmosphere during the heat treatment may be air pressure. Nitrogen gas may be used as the inner gas. The production process of TFT or the like may include formation of a nitride film. The nitrogen gas used in the heat treatment may be provided from the same nitrogen source using in formation of the nitrogen film. On the other hand, Ar gas may also be used as the inert gas.

(b) Alloy Composition of the Cu—Ca Alloy Target and Proportion of Ca in the Film of the Thin Film Interconnect.

By the heat treatment, Ca segregates in the interface between the copper alloy thin-film interconnect and the substrate or silicon oxide, and is oxidized and forms a reaction layer by chemical reaction with the substrate or the silicon oxide. The reaction layer prevents the interface diffusion of oxygen, and thereby suppresses the oxidization of Cu and exhibiting hydrogen plasma durability. In addition, adhesion of the film with the substrate made of $SiO_2$, glass or the like is improved by the formation of the reaction layer.

Where the proportion of Ca contained in the target used in the formation of Cu—Ca alloy film by the sputtering method is less than 0.5 atomic % in the sum of the amounts of Cu and Ca, the above-described effects are not exerted sufficiently, resulting in insufficient hydrogen plasma durability. On the other hand, where the proportion of Ca exceeds 5 atomic %, it is not preferable since the resistivity of the Cu—Ca thin film interconnect is given high resistivity. Therefore, the alloy composition of the Cu—Ca alloy target is preferably 0.5 atomic % or more and less than 5 atomic % of Ca, and the balance consisting of Cu and unavoidable impurities.

Where a Cu—Ca alloy film is formed by the below described sputtering method using a Cu—Ca alloy target that satisfies the above-described conditions, the as formed Cu—Ca alloy film has lower concentration than the target. However, since the Ca segregates to the interface between the film and the substrate or SiO$_2$ film, it was confirmed that the peak value of the proportion of an amount of Ca in sum of an amount of Cu and the amount of in the thin film in depth direction of the thin film is substantially the same as the proportion of an amount of Ca in the Cu—Ca alloy target.

(c) Heat Treatment Temperature

As a result of detailed experiments about the temperature during the heat treatment, the tape exfoliation test showed that satisfactory adhesion of Cu—Ca alloy film is obtained by heat treatment of the Cu—Ca alloy film in the above-described inert gas atmosphere containing a trace amount of oxygen at a temperature of 300° C. or more.

In addition, hydrogen plasma durability is improved by heat treatment at a temperature of 300° C. or more. On the other hand, heat treatment temperature exceeding 700° C. is not preferred since the substrate made of SiO$_2$, glass, or the like is deformed at that temperature. Therefore, it is preferable to control the heat treatment temperature to be 300 to 700° C.

(d) Average Thickness of the Cu—Ca Alloy Film

After forming a Cu—Ca alloy film by sputtering, cross section of the Cu—Ca alloy film and the substrate (SiO$_2$) was observed in detail. As a result, it was confirmed that an amorphous layer having a thickness of about 1 nm was formed by segregation of Ca on the surface of SiO$_2$ by the heat treatment in the inert gas atmosphere containing trace amount of oxygen. The segregated Ca is oxidized in the interface and forms CaO. According to CaO—SiO$_2$ phase diagram, CaO and SiO$_2$ react to form a plurality of calcium silicate layers composed of Ca$_2$SiO$_4$, Ca$_3$SiO$_5$, or the like. It is considered that these layers contribute to the adhesion of the Cu—Ca alloy film and the substrate. Where the average thickness of the Cu—Ca alloy film is less than 10 nm, the layer thickness of the calcium silicate layer is decreased, resulting in insufficient adhesion. On the other hand, the average thickness exceeding 500 nm requires too much time for forming the film. Therefore, it is not preferred based on the economic measure. In addition, the step height formed by the thin film interconnect is enlarged, and fractures of interlayer insulation film such as silicon nitride film are increased due to concentrated stress. Therefore, the film thickness exceeding 500 nm is not preferred. Therefore, average thickness of the Cu—Ca alloy film is preferably 10 to 500 nm.

On the other hand, resistivity of the film increases where the thickness of the film is less than 100 nm. Therefore, rather than using the Cu—Ca alloy film as a single layer film, it is preferable to use the Cu—Ca alloy film as an under-layer and form a pure Cu film as a conductive film on the under-layer.

Next, an embodiment of the method of forming a thin film interconnect and a thin film interconnect according to the present invention will be explained in detail based on examples.

EXAMPLE 1

ADC magnetron sputtering apparatus was used in formation of the thin-film interconnect. Targets each having a composition of 99.99 atomic % Cu (hereafter referred to as 4NCu), Cu-0.2 atomic % Ca (hereafter referred to as Cu-0.2Ca), Cu-0.5 atomic % Ca (hereafter referred to as Cu-0.5Ca), Cu-1 atomic % Ca (hereafter referred to as Cu-1Ca), Cu-2 atomic % Ca (hereafter referred to as Cu-2Ca), Cu-5 atomic % Ca (hereafter referred to as Cu-5Ca), Cu-7 atomic % Ca (hereafter referred to as Cu-7Ca) were used in sputtering. Silicon wafers with thermal oxide film (76.3 mm in diameter and 380 μm in thickness) were used as the substrates.

Formation of Cu Alloy Film

After evacuating the interior of the chamber to the vacuum level of 5×10$^{-5}$ Pa, pure Ar was introduced into the chamber and pressure of the Ar gas was controlled to be 0.67 Pa. Without heating the substrate, power density was controlled to be DC 3.3 W/cm$^2$, and film formation rate was controlled to be 4 nm/sec. The target thickness was controlled to be 5 to 500 nm.

Here the target thickness of the Cu alloy film was determined by film formation rate (nm/sec)×film formation time (sec.). As a result of observation of cross section of samples obtained by the present example using a scanning electron microscope, it was confirmed that each sample had an average film thickness similar to the target thickness.

Heat Treatment

Next, using an infrared ray heating furnace, each sample was subjected to heat treatment in an inert gas atmosphere containing trace amount of oxygen. After evacuating the interior of the chamber to the vacuum level of 0.5 Pa, the interior atmosphere of the chamber was replaced by nitrogen gas containing trace amount of oxygen, where the oxygen partial pressure was varied from 1×10$^{-3}$ to 1×10$^{-11}$ atm. The flow rate of the gas was controlled to be 1 L/min. and the pressure was controlled to be the air pressure.

Heat treatments were performed under the conditions of heating rate of 1° C./sec., heating temperature selected from 100° C., 200° C., 300° C., 400° C., 500° C., 600° C., and 700° C., and heating time of 30 minutes. The experiment was not performed at a temperature exceeding 700° C. since the substrate was deformed at that condition.

Evaluation of Adhesiveness with the Substrate

After the heat treatment of the substrate, the thin film formed on the substrate was subjected to evaluation of adhesion by a tape exfoliation test. In the practical process, the adhesion of the thin film was evaluated by the exfoliation state of the thin film interconnect after adhering the tape to the surface of the thin film interconnect and pulling off the tape. Firstly, using a cutter knife, cutting lines were formed lengthwise and crosswise in the thin film with an interval of 1 mm and 100 grids were formed in the thin film. Next, a cellophane tape was adhered tightly to the portion of the grids, and pulled off immediately with the angle of tape end of 45°. After that, the state of the grids in the thin-film was visually observed. In this experiment, the case showing no exfoliation was evaluated as a sample of satisfactory adhesion. Adhesion of each thin film interconnect was examined by counting the numbers of exfoliated grids over 100 grids. The results are shown in Tables 1 to 3. In Tables 1 to 3, samples that showed no exfoliation were evaluated as A, samples that showed exfoliation of 1 to 3 grids were evaluated as B, samples that showed exfoliation of 4 to 10 grids were evaluated as C, samples that showed 10 or more grids were evaluated as D.

Evaluation of Hydrogen Durability

After the nitrogen heat treatment, the samples were subjected to heating at 300° C. for 3 minutes in an hydrogen-nitrogen mixed gas atmosphere in which hydrogen and nitrogen were mixed in a proportion of 1:1. Hydrogen durability of the thin film was examined by a tape exfoliation test performed in similar manner as the above-described test. The results are also shown in Tables 1 to 3.

In Tables 1 to 3, column of nitrogen shows results of tape exfoliation test after the nitrogen heat treatment, and the column of hydrogen shows the results of hydrogen durability test. Oxygen partial pressure in the heat treatment was 10$^{-7}$ atm in Tables 1 and 2. The target film thickness of each sample was 300 nm in Tables 1 and 3. Nitrogen heat treatment temperature was 300° C. in Tables 2 and 3.

Analysis of Ca Concentration in the Film

Ca concentration in the interface of the Cu-alloy film and the glass substrate and the silicon oxide film was determined by depth direction analysis by Auger electron spectroscopy. Argon ion etching was performed by the Zalar rotation method. Acceleration voltage was 5 kV, electric current was 10 nA, and inclination angle of the sample was 30 degrees.

adhesion and hydrogen durability were confirmed where the thickness of the Cu—Ca alloy film after the nitrogen heat treatment was in the range of 100 to 300 nm. As it is obvious from the results shown in Table 3, excellent adhesion and hydrogen durability were confirmed where the oxygen partial pressure in the time of nitrogen heat treatment was in the range of $10^{-3}$ to $10^{-10}$ atm, and specifically excellent adhesion and hydrogen durability were confirmed where the oxy-

TABLE 1

| Nitrogen heat treatment temperature (° C.) | 4NCu | | 6NCu | | Cu—0.2Ca | | Cu—0.5Ca | | Cu—1Ca | | Cu—2Ca | | Cu—5Ca | | Cu—7Ca | |
|---|---|---|---|---|---|---|---|---|---|---|---|---|---|---|---|---|
| | $N_2$ | $H_2$ | $N_2$ | $H_2$ | $N_2$ | $H_2$ | $N_2$ | $H_2$ | $N_2$ | $H_2$ | $N_2$ | $H_2$ | $N_2$ | $H_2$ | $N_2$ | $H_2$ |
| As Depo. | D | D | D | D | D | D | D | D | D | D | D | D | D | D | D | D |
| 100 | D | D | D | D | D | D | D | D | D | D | D | D | D | D | D | D |
| 200 | D | D | D | D | D | D | D | D | D | D | D | D | D | D | D | D |
| 300 | A | D | A | D | A | D | A | A | A | A | A | A | A | A | A | A |
| 400 | A | D | A | D | A | D | A | A | A | A | A | A | A | A | A | A |
| 500 | A | D | A | D | A | D | A | A | A | A | A | A | A | A | A | A |
| 600 | A | D | A | D | A | D | A | A | A | A | A | A | A | A | A | A |
| 700 | A | D | A | D | A | D | A | A | A | A | A | A | A | A | A | A |

TABLE 2

| Target average film thickness (nm) | 4NCu | | 6NCu | | Cu—0.2Ca | | Cu—0.5Ca | | Cu—1Ca | | Cu—2Ca | | Cu—5Ca | | Cu—7Ca | |
|---|---|---|---|---|---|---|---|---|---|---|---|---|---|---|---|---|
| | $N_2$ | $H_2$ | $N_2$ | $H_2$ | $N_2$ | $H_2$ | $N_2$ | $H_2$ | $N_2$ | $H_2$ | $N_2$ | $H_2$ | $N_2$ | $H_2$ | $N_2$ | $H_2$ |
| 5 | A | D | A | D | A | D | B | C | A | C | A | C | A | C | A | C |
| 10 | A | D | A | D | A | D | A | B | A | B | A | A | A | A | A | A |
| 100 | A | D | A | D | A | D | A | B | A | B | A | A | A | A | A | A |
| 300 | A | D | A | D | A | D | A | A | A | A | A | A | A | A | A | A |
| 500 | A | D | A | D | A | D | A | A | A | A | A | A | A | A | A | A |

TABLE 3

| Oxygen partial pressure (atm) | 4NCu | | 6NCu | | Cu—0.2Ca | | Cu—0.5Ca | | Cu—1Ca | | Cu—2Ca | | Cu—5Ca | | Cu—7Ca | |
|---|---|---|---|---|---|---|---|---|---|---|---|---|---|---|---|---|
| | $N_2$ | $H_2$ | $N_2$ | $H_2$ | $N_2$ | $H_2$ | $N_2$ | $H_2$ | $N_2$ | $H_2$ | $N_2$ | $H_2$ | $N_2$ | $H_2$ | $N_2$ | $H_2$ |
| $1 \times 10^{-3}$ | A | D | A | D | A | D | A | B | A | A | A | A | A | A | A | A |
| $1 \times 10^{-4}$ | A | D | A | D | A | D | A | B | A | A | A | A | A | A | A | A |
| $1 \times 10^{-7}$ | A | D | A | D | A | D | A | A | A | A | A | A | A | A | A | A |
| $1 \times 10^{-10}$ | A | D | A | D | A | D | A | B | A | B | A | B | A | B | A | A |
| $1 \times 10^{-11}$ | D | D | D | D | D | D | D | D | D | D | D | D | A | C | A | C |

As it is understood from the results shown in Tables 1 to 3, the films formed using the targets containing 0.5 to 7 atomic % of Ca showed excellent adhesion and hydrogen durability. It was confirmed that the films formed using the targets containing 1 to 7 atomic % of Ca showed particularly excellent adhesion and hydrogen durability. As it is understood from the results shown in Table 1, excellent adhesion and hydrogen durability were confirmed where the nitrogen heat treatment temperature was in the range of 300 to 700° C. As it is understood from the results shown in Table 2, excellent adhesion and hydrogen durability were confirmed where the thickness of the Cu—Ca alloy film after the nitrogen heat treatment was in the range of 10 to 500 nm, and particularly excellent gen partial pressure in the time of nitrogen heat treatment was in the range of $10^{-4}$ to $10^{-10}$ atm.

Structure Analysis of the Interface Between the Thin Film Interconnect and the Substrate The Cu film and the Cu—Ca alloy film after the above-described nitrogen heat treatment were subjected to depth-direction analysis using XPS in order to analyze the structure of the interface with the substrate. The films after the nitrogen heat treatment at 300° C. and comparative film that has not been heat treated were analyzed. 4NCu target was used in the formation of the Cu film. Cu-2Ca target was used in the formation of Cu—Ca alloy film. $SiO_2$ was used as the substrate. A trace amount of oxygen was controlled to be $1\times10^{-5}$ atm in oxygen partial pressure.

As a result, in the film that has not been heat treated, the surface was gradually etched by sputter-etching of Ar ions, and O and Si were detected at the sputtering time of 60 to 70 minutes. After that, intensities of O and Si increased with increasing the sputtering time, and the intensity of O reached a constant level at a sputtering time of 100 to 120 minutes. On the other hand, in the film that experienced the nitrogen heat treatment, O and Si were detected at sputtering time of 50 minutes. After that, intensities of O and Si increased with increasing sputtering time, and the intensity of O reached about constant level at sputtering time of 100 to 120 minutes. From the above-described results, it is considered that etching proceeded to the interface between the Cu film (Cu—Ca alloy film) and the substrate at the sputtering time of 100 to 120 minutes. Therefore, the sputtering time before spectrum analysis using XPS was controlled to be 80 minutes, 100 minutes, and 120 minutes. The results are shown in FIGS. 4A, 4B, 4C and FIGS. 5A, 5B, and 5C. Each sample showed CuLMM spectrum that was auger electron spectrum excited by X-ray, where the peak position of CuO was 569 eV, peak position of Cu was 568 eV, and the peak position of $Cu_2O$ was 570 eV.

Figure 4A:
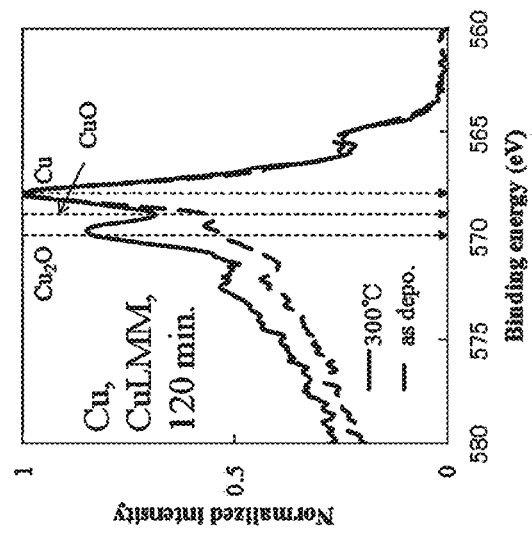
FIGS. 4A, 4B, and 4C are drawings that show results of XPS analysis of Cu film before and after the heat treatment subsequent to the formation of the Cu film.
Figure 4B:
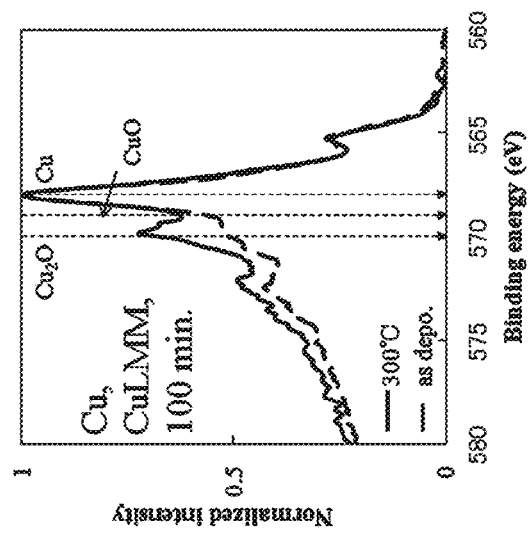
Figure 4C:
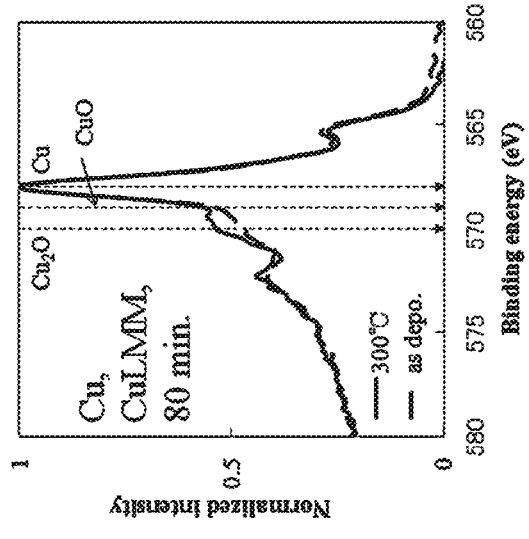
Figure 5A:
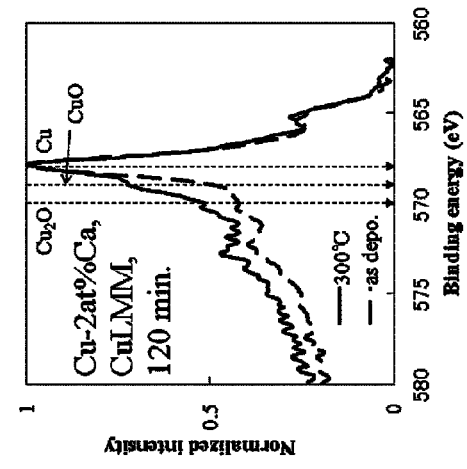
FIGS. 5A, 5B, and 5C are drawings that show results of XPS analysis of Cu—Ca alloy film before and after the heat treatment subsequent to the formation of the Cu—Ca film.
Figure 5B:
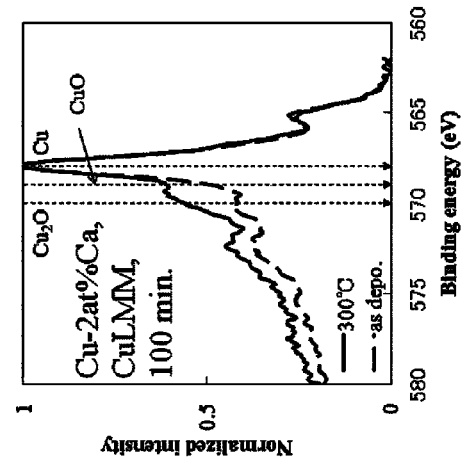
Figure 5C:
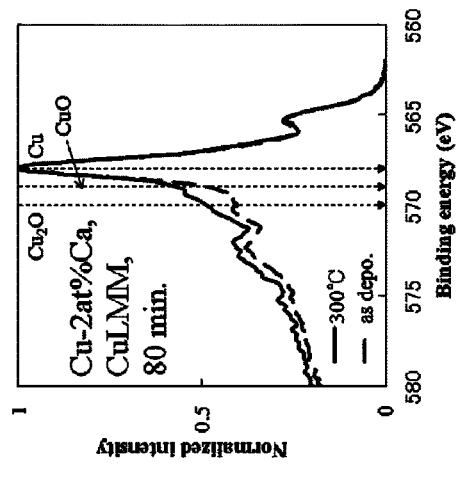

Here, FIGS. 4A to 4C show results of Cu film in a state after the film formation and before the heat treatment (as depo., dot line), and in a state after the nitrogen heat treatment (300° C., solid line). FIG. 4A shows the result of sputtering time of 80 minutes, FIG. 4B shows the result of sputtering for 100 minutes, and FIG. 4C shows the result of sputtering for 120 minutes. On the other hand, FIGS. 5A to 5C show results of Cu—Ca alloy film at a state after the film formation and before the heat treatment (as depo., dot line), and at a state after the nitrogen heat treatment (300° C., solid line). FIG. 5A shows the result of sputtering for 80 minutes, FIG. 5B shows the result of sputtering for 100 minutes, and FIG. 5C shows the result of sputtering for 120 minutes.

Presence of Cu, $Cu_2O$, and CuO was detected in the spectrum of CuLMM. In the Cu film, peak concentration of $Cu_2O$ increased in accordance with decreasing distance from the interface between the film and $SiO_2$ due to nitrogen heat treatment at 300° C. Increase of $Cu_2O$ concentration in the vicinity of the interface was observed due to the nitrogen heat treatment. On the other hand, in the Cu-2Ca film, peak value of $Cu_2O$ increased by the nitrogen heat treatment was lower than that of the Cu film, showing that generation of $Cu_2O$ in the interface was suppressed by addition of Ca. $Cu_2O$ is easily reduced by hydrogen and generates water. The generated water concentrates to the interface and forms micro-voids resulting in the deterioration of adhesion. It is considered that hydrogen durability of Cu thin film interconnect added with Ca was improved since the generation of water due to hydrogen reduction was suppressed as a result of suppression of $Cu_2O$ generation by the addition of Ca.

Evaluation of Resistivity

The samples evaluated as C, B, A in the evaluation of hydrogen durability were selected from the films formed using the above-described targets. After hydrogen treatment for the evaluation of the hydrogen durability, resistivity of each film at room temperature was measured by four terminal method. The films having a thickness of 5 nm or 10 nm were not measured since the measurement cannot be performed correctly in a thin film due to surface reflection of electron. The results of measurements of the resistivity are shown in Tables 4 to 6. In Tables 4 to 6, D denotes samples which were evaluated as D in evaluation of hydrogen durability. The units of the value of the resistivity are $\mu\Omega$ cm.

TABLE 4

| Nitrogen heat treatment temperature (° C.) | Target composition (at %) | | | | | | | |
|---|---|---|---|---|---|---|---|---|
| | 4NCu | 6NCu | Cu—0.2Ca | Cu—0.5Ca | Cu—1Ca | Cu—2Ca | Cu—5Ca | Cu—7Ca |
| As Depo. | D | D | D | D | D | D | D | D |
| 100 | D | D | D | D | D | D | D | D |
| 200 | D | D | D | D | D | D | D | D |
| 300 | D | D | D | 2.0 | 2.1 | 2.1 | 2.2 | 4.0 |
| 400 | D | D | D | 2.4 | 3.4 | 4.5 | 4.4 | 6.9 |
| 500 | D | D | D | 2.3 | 3.0 | 4.3 | 4.3 | 7.1 |
| 600 | D | D | D | 2.4 | 3.1 | 4.2 | 4.2 | 6.8 |
| 700 | D | D | D | 2.2 | 3.2 | 4.3 | 4.2 | 8.5 | unit: $\mu\Omega$cm

TABLE 5

| Target average thickness (nm) | Target composition (at %) | | | | | | | |
|---|---|---|---|---|---|---|---|---|
| | 4NCu | 6NCu | Cu—0.2Ca | Cu—0.5Ca | Cu—1Ca | Cu—2Ca | Cu—5Ca | Cu—7Ca |
| 5 | D | D | D | — | — | — | — | — |
| 10 | D | D | D | — | — | — | — | — |
| 100 | D | D | D | 2.2 | 2.0 | 2.2 | 2.3 | 4.2 |
| 300 | D | D | D | 2.0 | 2.1 | 2.1 | 2.2 | 4.0 |
| 500 | D | D | D | 2.2 | 2.2 | 2.2 | 2.3 | 4.5 | unit: $\mu\Omega$cm

TABLE 6

| Oxygen partial pressure (atm) | Target compostion (at %) | | | | | | | |
|---|---|---|---|---|---|---|---|---|
| | 4NCu | 6NCu | Cu—0.2Ca | Cu—0.5Ca | Cu—1Ca | Cu—2Ca | Cu—5Ca | Cu—7Ca |
| $1 \times 10^{-3}$ | D | D | D | 5.5 | 5.2 | 5.5 | 5.9 | 7.5 |
| $1 \times 10^{-4}$ | D | D | D | 2.2 | 2.0 | 2.5 | 2.3 | 5.5 |
| $1 \times 10^{-7}$ | D | D | D | 2.0 | 2.1 | 2.1 | 2.3 | 4.0 |
| $1 \times 10^{-10}$ | D | D | D | 2.3 | 2.4 | 2.2 | 2.1 | 4.2 |
| $1 \times 10^{-11}$ | D | D | D | D | D | D | 8.1 | 4.1 | unit: $\mu\Omega$cm

As it is understood from the results shown in Tables 4 to 6, it was confirmed that resistivity of the Cu—Ca alloy film increased where the Ca content exceeded 5 atomic %.

Although the films having a thickness of 5 nm or 10 nm were not measured, these films can be used with no problems by using the Cu—Ca alloy film as an adhesion layer with an under-layer and depositing a pure Cu film having low resistivity as a conductive layer on the adhesion layer.

Next, another embodiment of the method of forming a thin film interconnect and a thin film interconnect according to the present invention are explained based on the example.

EXAMPLE 2

Firstly, in the same manner as Example 1, a Cu—Ca alloy film was formed on the surface of a substrate by a sputtering method using a Cu—Ca alloy target. Next, a Cu film was formed on the Cu—Ca alloy film by the sputtering method using a Cu target (6NCu).

After thus forming a double layered film constituted of the Cu—Ca alloy and the Cu, a thin film interconnect was formed by heat treatment in an inert gas atmosphere containing trace amount of oxygen. FIG. 3B shows a schematic flow diagram of this formation method.

Next, adhesion and hydrogen durability of the film were evaluated in the same matter as Example 1. As a result, the same result as Example 1 was obtained. That is, also in the case where Cu film is formed on the Cu—Ca alloy film, adhesion and hydrogen durability are improved by the heat treatment in the inert gas atmosphere containing trace amount of oxygen in the similar manner as Example 1. This improvement is explained by faster diffusion rate of oxygen in the Cu film formed on the surface than the reaction rate of oxygen in the interface, resulting in progress of oxidization of Cu—Ca alloy even in the case of forming the Cu film on the Cu—Ca alloy film. Further, it was confirmed that a excellent conductivity of Cu contributed to reduction of resistivity in thin film interconnect as a result of forming Cu on the Cu—Ca alloy.

Next, another embodiment of the method of forming a thin film interconnect and a thin film interconnect according to the present invention is explained based on the Example.

EXAMPLE 3

Firstly, in accordance with the same manner as Example 1, Cu—Ca alloy film was formed on the substrate using a Cu—Ca alloy target, and the film was subsequently heat treatment in an inert gas atmosphere containing oxygen.

Next, a Cu film was formed on the heat treated Cu—Ca alloy film (hereafter, referred to as property modified Cu—Ca alloy film) by sputtering method using a Cu target (6NCu).

Thus a double layered thin-film interconnect constituted of the property modified Cu—Ca alloy film and the Cu film was formed on the substrate.

Next, adhesion and hydrogen durability of the film were evaluated in the same manner as Example 1. Further, it was confirmed that a excellent conductivity of Cu contributed to reduction of resistivity in thin film interconnect as a result of forming Cu on the Cu—Ca alloy.

The present invention was made based on the detailed observation of microstructure in the interface between the Cu film and the substrate, and examination of mechanism of exerting hydrogen durability and adhesion of the film. The present invention has remarkable effects in improving adhesion and hydrogen durability without increasing resistivity of the Cu based thin film interconnect, and in contributing reduction of cost. Therefore, the present invention has excellent industrial applicability.

While preferred embodiments of the invention have been described and illustrated above, it should be understood that these are exemplary of the invention and are not to be considered as limiting. Additions, omissions, substitutions, and other modifications can be made without departing from the scope of the present invention. Accordingly, the invention is not to be considered as being limited by the foregoing description, and is only limited by the scope of the appended claims.

What is claimed is:

1. A method of forming a thin film interconnect in which a film is formed by sputtering method using a Cu—Ca alloy target, the method comprising:
    forming a Cu—Ca alloy film by sputtering method using a Cu—Ca alloy target that contains 0.5 atomic % or more and less than 5 atomic % of Ca, and the balance consisting of Cu and unavoidable impurities; and
    performing heat treatment of the Cu—Ca alloy film at a temperature of 300 to 700° C. in an inert gas atmosphere containing trace amount of oxygen defined by oxygen partial pressure in the range of $10^{-4}$ to $10^{-10}$ atm.

2. A method of forming a thin film interconnect according to claim 1, wherein an average thickness of the Cu—Ca alloy film is 10 to 500 nm.

3. A method of forming a thin film interconnect according to claim 1, further comprising forming a Cu film on the Cu—Ca alloy film after forming the Cu—Ca alloy film.

4. A method of forming a thin film interconnect according to claim 1, further comprising forming a Cu film on the Cu—Ca alloy film after the heat treatment.

5. A thin-film interconnect formed by a method according to claim 1, wherein the peak value of Ca concentration of the Cu—Ca alloy film in depth direction of the film measured by auger electron spectroscopy is 0.5 atomic % or more and less than 5 atomic % in in proportion of an amount of Ca in sum of an amount of Cu and the amount of Ca.

6. A thin-film interconnect formed by a method according to claim 3, wherein the peak value of Ca concentration of the Cu—Ca alloy film in depth direction of the film measured by auger electron spectroscopy is 0.5 atomic % or more and less than 5 atomic % in proportion of an amount of Ca in sum of an amount of Cu and the amount of Ca.

7. A thin-film interconnect formed by a method according to claim 4, wherein the peak value of Ca concentration of the Cu—Ca alloy film in depth direction of the film measured by auger electron spectroscopy is 0.5 atomic % or more and less than 5 atomic % in proportion of an amount of Ca in sum of an amount of Cu and the amount of Ca.

8. A thin-film interconnect according to claim 5, wherein an average thickness of the Cu—Ca alloy film is 10 to 500 nm.

* * * * *